United States Patent [19]

Mehta

[11] Patent Number: 4,979,193
[45] Date of Patent: Dec. 18, 1990

[54] METHOD AND APPARATUS FOR TESTING A BINARY COUNTER

[75] Inventor: Mayur H. Mehta, Austin, Tex.

[73] Assignee: Advanced Micro Devices, Inc., Sunnyvale, Calif.

[21] Appl. No.: 343,215

[22] Filed: Apr. 26, 1989

[51] Int. Cl.⁵ .......................................... H03K 21/40
[52] U.S. Cl. ......................................... 377/29; 377/55
[58] Field of Search .................... 377/28, 29, 116, 81, 377/55

[56] References Cited

U.S. PATENT DOCUMENTS

| | | | |
|---|---|---|---|
| 4,611,337 | 9/1986 | Evans | 377/116 |
| 4,661,930 | 4/1987 | Tran | 377/28 |
| 4,736,395 | 4/1988 | Sugihara | 377/29 |
| 4,745,630 | 5/1988 | Underwood | 377/29 |
| 4,759,043 | 7/1988 | Lewis | 377/116 |
| 4,852,130 | 7/1989 | Draxelmayr | 377/81 |

*Primary Examiner*—John S. Heyman
*Attorney, Agent, or Firm*—Foley & Lardner

[57] ABSTRACT

A multi-stage M-bit binary counter is disclosed including S counter stages in which each counter stage includes an N-bit counter ($M = S \times N$). During a test operation, the stages are decoupled for individual operation, a count value is loaded into the N-bit counter provided in each of the stages, and the N-bit counters of each stage are clocked $2^N$ times to check independently the function of the N-bit counters. The stages are then coupled together to function as a multi-stage M-bit counter and a single clock pulse is supplied to the M-bit counter to check the carry propagation between stages. If the N-bit counters are of a type which only generate an output when fully incremented or decremented and the actually count value cannot be read from the M-bit counter, then the stages are decoupled together for a second time and the N-bit counters are clocked an additional $2^N$ times.

8 Claims, 2 Drawing Sheets

METHOD AND APPARATUS FOR TESTING A BINARY COUNTER

BACKGROUND OF THE INVENTION

The present invention is related to the field of binary counters. In particular, the present invention is directed to a method and apparatus for quickly and fully testing a multi-stage binary counter.

Many applications of digital logic design require the use of relatively high resolution M-bit binary counters. In some cases, the high resolution M-bit binary counter is implemented by coupling several smaller resolution N-bit counters together in several stages, in which N is equal to M divided by the number of stages. For example, a sixteen-bit resolution binary counter can be implemented by coupling four four-bit binary counters together. In such a configuration, the carry output signal (COUT) from each counter is coupled to the carry input (CIN) of counter in the next stage.

It is generally desirable to fully test the operation of the binary counter at some stage regardless of the particular application in which the binary counter is employed. Testing of an M-bit binary countdown counter can be performed, for example, by loading the counter with all logical ones, fully decrementing the counter $2^M$ times, and then checking to see if the output of the counter is zero. The above-described testing method, however, requires an unacceptable amount of time for many digital logic applications, as the counter must always be decremented $2^M$ times to fully test its operation.

In the case of a multi-stage counter, the testing time can be reduced by decoupling the stages and testing each stage simultaneously. For example in the sixteen-bit counter mentioned above, the four four-bit counters can be tested simultaneously by decoupling the stages with a switching mechanism, decrementing each stage $2^4$ times, and checking the output signal from each stage. The problem with this testing approach is that decoupling the stages requires that the carry outputs and carry inputs be disconnected between stages to permit independent operation of the counters, which would prevent the carry propagation between the four counters from being tested. Thus, overall counter operation cannot be fully tested.

SUMMARY OF THE INVENTION

The present invention provides a method and apparatus for quickly and fully testing an M-bit multi-stage binary counter, including the carry propagation between counter stages.

In particular, a multi-stage M-bit binary counter is disclosed including S counter stages in which each counter stage includes an N-bit counter (M=SxN). During a test operation, the stages are decoupled for individual operation, a count value is loaded into the N-bit counter provided in each of the stages, and the N-bit counters of each stage are clocked $2^N$ times to independently check the function of the N-bit counters. The stages are then coupled together to function as a multi-stage M-bit counter and a single clock pulse is supplied to the M-bit counter to check the carry propagation between stages. If the N-bit counters are of a type which only generate an output when fully incremented or decremented and the actual count value cannot be read from the M-bit counter, then the stages are decoupled for a second time and the N-bit counters are clocked an additional $2^N$ times.

For example, in the case of a sixteen-bit multi-stage counter, the initial cycling of $2^N$ clock pulses tests the basic counting function of each four-bit counter provided in the four stages by counting down from FFFF hex to 0000. Coupling the four counters together to function as an sixteen-bit counter and then clocking the sixteen-bit counter one time will check the carry propagation between the stages counter by changing the count value in each four-bit counter 0000 to FFFF, or all F's for the sixteen-bit counter, if the carry function is working properly. The count value cannot be directly determined, however, if the four-bit counters are of a type that generate an output signal only when fully incremented or decremented. Thus, the four-bit counters must be clocked an additional $2^N$ times to count down from FFFF to 0000 in order to generate an output signal that can be checked for an indication of proper operation.

BRIEF DESCRIPTION OF THE DRAWING

With the above as background, reference should now be made to the following detailed description of the preferred embodiments in conjunction with the drawings, in which.

DETAILED DESCRIPTION OF THE PREFERRED EMBODIMENTS

Figure 1:
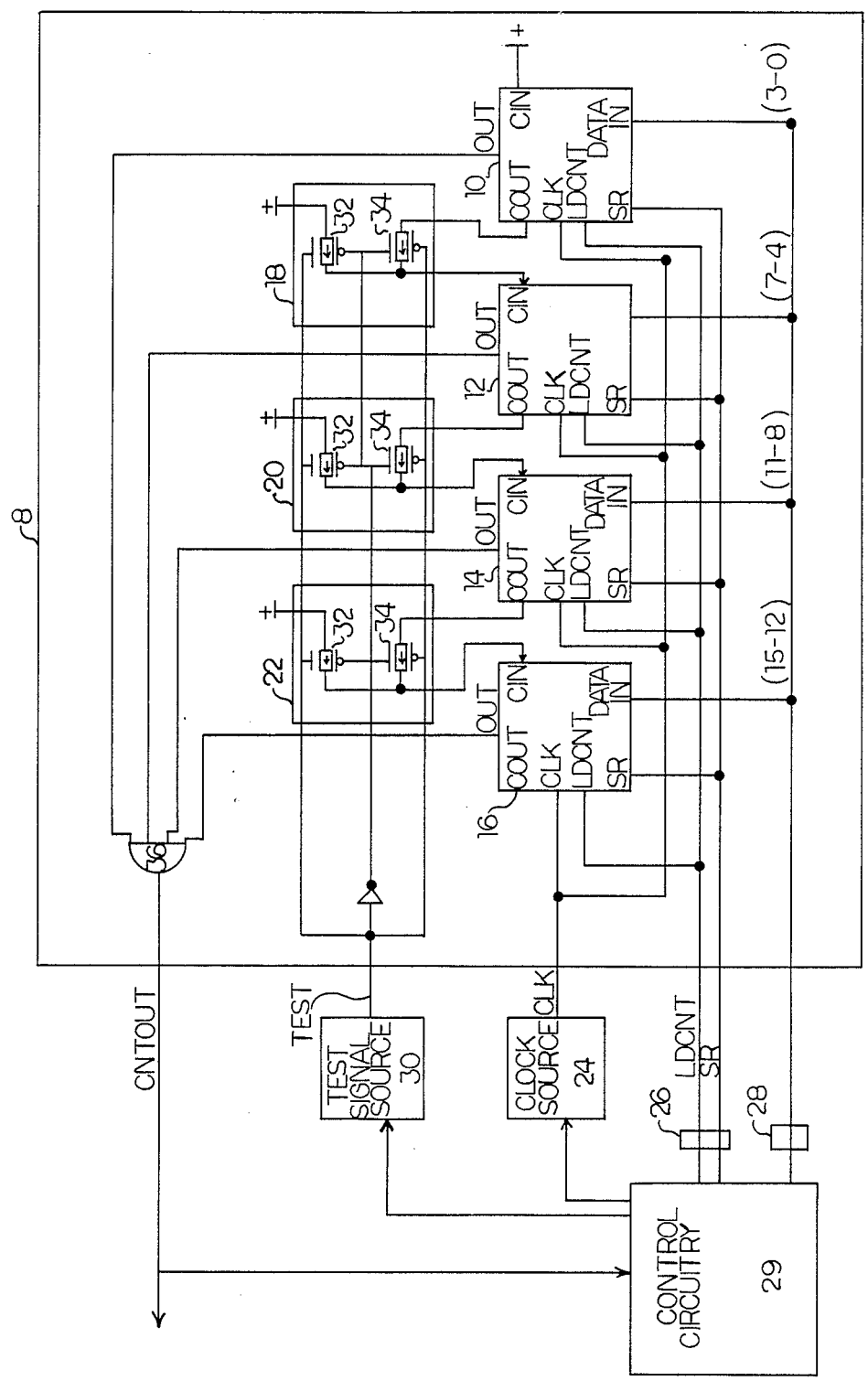
FIG. 1 illustrates a multi-stage M-bit counter according to a first embodiment of the invention, wherein the M-bit counter includes a plurality of N-bit counters that generate an output signal only when fully decremented or incremented.

Referring now to FIG. 1, a multi-stage sixteen-bit binary countdown counter 8 is shown having four four-bit counters 10–16, wherein each counter represents one stage, and three multiplexer couplers 18–22. Each of the four-bit counters 10–16 are coupled to a clock source 24, a control bus 26 and a sixteen bit data bus 28. The control bus 26 and data bus 28 are coupled to control circuitry 29 which controls the initial loading of the counters 10–16 as will be discussed in greater detail below. The multiplexer couplers 18–22 are connected to a test signal source 30 that generates a control signal TEST and is controlled by the processing unit 29. Alternatively, the processing unit 29 may generate the TEST signal directly. Each of the multiplexer 18–22 contain an upper transistor 32 and a lower transistor 34.

It will be readily understood by those having ordinary skill in the art that the counter 8 can be implemented as a discrete device or can be integrated with the control circuitry 29, clock source 24 and test signal source 30 in a single device. The control circuitry 29 can be implemented in hardware as a state machine or can be a central processing unit of a microprocessor. Other variations are of course possible and the invention is not limited to the specific configuration shown in FIG. 1.

In the embodiment illustrated, the four-bit counters 10–16 will not decrement unless CIN is at a high "1" logic level. Each of the counters 10–16 generates an output signal OUT that switches to a logic "1" when the counter has decremented to zero. The carry outputs (COUT) and carry inputs (CIN) of the four-bit counters 10-16 are connected to the multiplexers 18-22 such that when the test signal source 30 generates a low logic level signal (TEST=0), the lower transistors 34 of the multiplexers 18-22 are turned on and the COUT of each counter 10-16 is connected to the CIN of the counter in the next stage, so that the four-bit counters 10-16 are coupled together to function normally as a sixteen-bit counter. When the signal source 26 generates a high logic level signal (TEST=1), the lower transistors 34 are turned off and the upper transistors 32 of the multiplexer 18-22 are turned on to couple CIN of each of the counters 10-16 to an activation potential, which in this case is a logic high level, in order to permit each of the counters 10-16 to be operated independently.

The operation of the counter 8 during the test phase will now be discussed in greater detail. As mentioned above, each of the counters 10-16 are coupled to a data bus 28 and a control bus 26. The control bus 26 has two control lines; set/reset input (SR) which resets the counters 10-16, and load count (LDCNT) which causes an initial count value provided on the data bus 28 to be loaded into the counters 10-16. At the beginning of a test cycle, the control circuitry 29 issues the LDCNT signal to load the counters 10-16 with all ones (FFFF) via the data bus 28 and activates the test signal source 30 to drive TEST high (TEST=1). When TEST goes high, the multiplexer 18-22 pull the CIN lines of each of the counters 10-16 high. The clock source 24 then generates $2^4$ clock signals causing the counters 10-16 to be decremented to zero and the OUT line of the counters 10-16 to be driven high if the counters have functioned properly. The OUT lines of the counters 10-16 are combined by a gate 36 that generates a CNTOUT signal for the counter 8 which is supplied to the control circuitry 29.

After $2^4$ clock pulses, the control circuitry 29 checks to see if CNTOUT is high indicating that the counters 10-16 have properly counted down to zero. If CNTOUT is not high, the counter 8 has failed the test and the control circuitry 29 aborts the test mode. If CNOUT is high, the processing unit 29 controls the test signal source 30 to drive TEST low to turn off the upper transistors 32 and turn on the lower transistors 34 of the multiplexer couplers 18-22. The counter 8 is now configured to function as a sixteen-bit counter. The clock source 24 then generates a single clock pulse which causes the sixteen-bit counter to decrement to FFFF hex if the carry propagation between the counters 10-16 is working properly.

As the count value in the counters 10-16 cannot be read directly, the counters 10-16 must be fully decremented a second time in order to generate an output signal which will indicate proper carry propagation. Thus, the control circuitry 29 controls the test signal source to drive TEST high, causing the sixteen-bit counter 8 to once more function as four independent four-bit counters, and the clock source 29 generates $2^4$ clock pulses, causing the counters 10-16 to decrement to zero once more, thereby driving the OUT line of each counters 10-16 high which in turn drives CNTOUT high if the counters 10-16 have functioned properly. The control circuitry 29 then checks the status of the CNTOUT to determine if the test has been successfully completed.

The complete operation of the counter 8 including the carry function of each of the counters 10-16, can therefore be tested with only $2^4+2^4+1$ or $2^5+1$ clock cycles. This is a significant reduction over the $2^{16}$ clock cycles required to count down the sixteen-bit multistage counter 8 as a whole to test the carry function of the stages.

It will be understood that the above description is of a preferred exemplary embodiment of the present invention, and the invention is not limited to the specific form shown. For example, the embodiment illustrated is a count-down counter, but the present invention is equally applicable to a count-up counter. In such a case, the stages of the count-up counter would initially be loaded with 0000 and the stages would be independently counted up to FFFF. The stages would then be coupled together to function as a full sixteen-bit counter, and would then be incremented from FFFF to 0000. The stages would then be separated to work independently and would then be counted up to FFFF.

Figure 2:
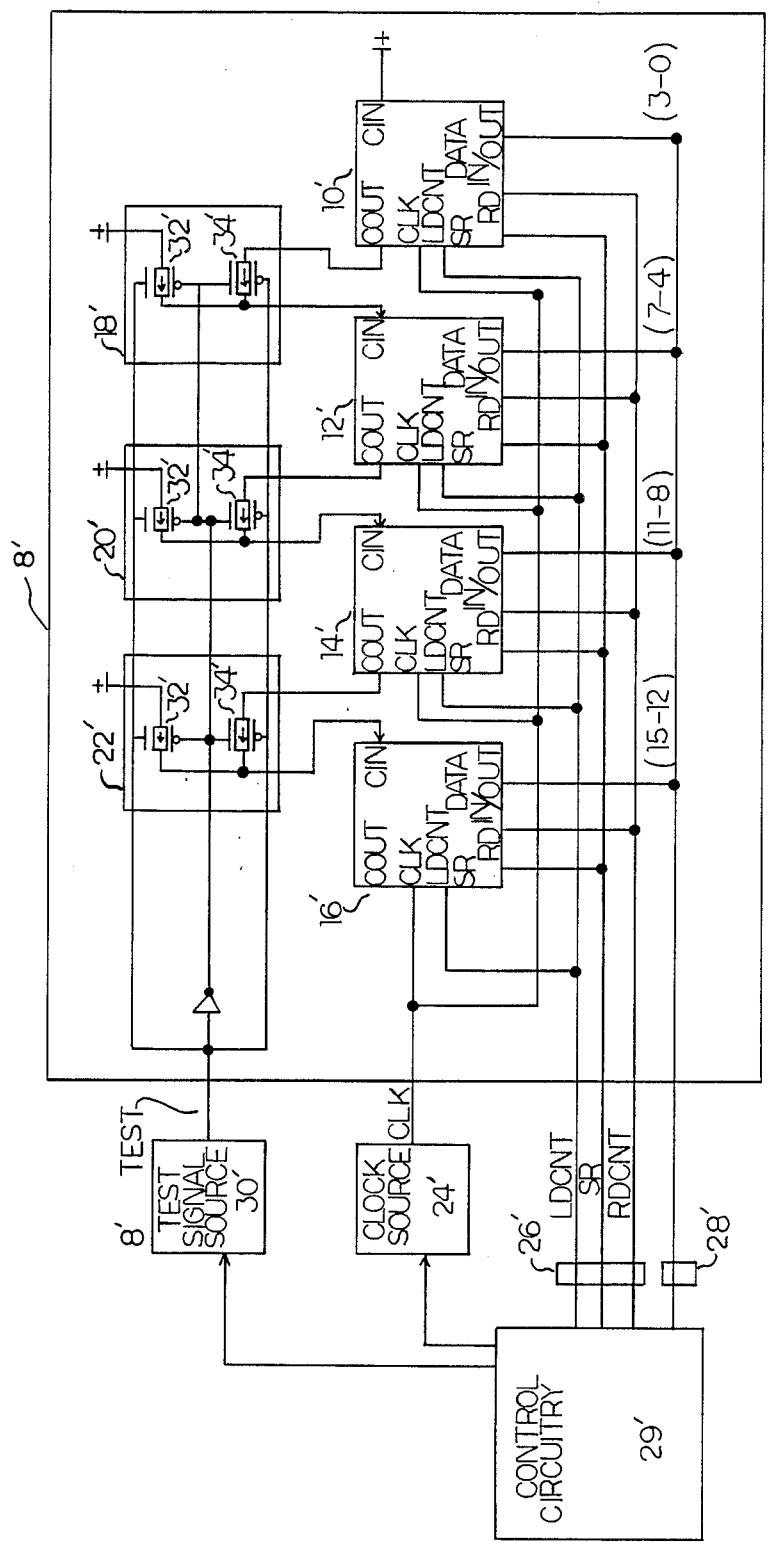
FIG. 2 illustrates a multi-stage M-bit counter according to a second embodiment of the invention, wherein the M-bit counter includes a plurality of N-bit counters from which a count value can be directly read.

Also the illustrated embodiment employed counters having a single output to indicate when the count-down had been completed. If counters are employed in which the actual value of the counter can be read, the second full cycling of the counters can be avoided. For example, FIG. 2 illustrates a sixteen-bit countdown counter 8' in which the counter output can be directly read by the control circuitry 29' via the data bus 28' when a read count RDCNT signal is issued by the control circuitry 29'. In the embodiment illustrated in FIG. 2, the count down counters 10'-16' would be loaded with FFFF and then independently decremented to 0000. The counters 10'-16' would then be coupled together via the multiplexers 18'-22' to function as a full sixteen bit counter and decremented once to FFFF. The value of the counters 10'-16' would then be read out by the control circuitry 29' to determine if the counter 8' was functioning properly. In such a case, the total number of clock cycles needed would be $2^N+1$. Additional, variations and modifications can be effected within the spirit and scope of the appended claims.

What is claimed is:

1. A method of operating an M-bit binary counter to test functions of said M-bit binary counter said M-bit binary counter including a plurality of stages, wherein each of said stages includes an N-bit counter, said method comprising:
    a. decoupling said stages of said M-bit binary counter to permit individual operation of said N-bit counter in each of said stages;
    b. loading a count value into said N-bit counter in each of said stages;
    c. clocking said N-bit counter of each of said stages $2^N$ times;
    d. coupling said stages of said M-bit binary counter back together;
    e. clocking said M-bit counter one time;
    f. checking the output of said counter to determine if the counter is working properly.

2. A method of operating an M-bit counter as claimed in claim 1, further comprising decoupling said stages of said M-bit counter to permit individual operation after step (e) and thereafter clocking said N-bit counter of each stage $2^N$ times prior to step (f).

3. A method as set forth in claim 1, wherein N is greater than or equal to 2.

4. A method as set forth in claim 2, wherein N is greater than or equal to 2.

5. An M-bit binary counter comprising:
    a. a plurality of count stages, each of said stages including an N-bit counter;

b. first means for decoupling said stages of said M-bit binary counter to permit individual operation of said N-bit counter in each of said stages;

c. second means for loading a count value into said N-bit counter in each of said stages;

d. third means for clocking said N-bit counter of each of said stages $2^N$ times after said second means has loaded said count value;

e. fourth means for coupling said stages of said M-bit binary counter together after said third means has clocked said N-bit counter of each of said stages $2^N$ times;

f. fifth means for clocking said M-bit counter one time after said fourth means has coupled said stages of said M-bit binary counter together; and g. sixth means for checking the output of said counter to determine if the counter is working properly after said fifth means has clocked said M-bit counter one time.

6. An M-bit binary counter as set forth in claim 5, wherein N is greater than or equal to 2.

7. An M-bit binary counter comprising:

a. a plurality of count stages, each of said stages including an N-bit counter;

b. first means for decoupling said stages of said M-bit binary counter to permit individual operation of said N-bit counter in each of said stages;

c. second means for loading a count value into said N-bit counter in each of said stages;

d. third means for clocking said N-bit counter of each of said stages $2^N$ times after said second means has loaded said count value;

e. fourth means for coupling said stages of said M-bit binary counter together after said third means has clocked said N-bit counter of each of said stages $2^N$ times;

f. fifth means for clocking said M-bit counter one time after said fourth means has coupled said stages of said M-bit binary counter together;

g. sixth means for decoupling said stages of said M-bit binary counter to permit individual operation of said N-bit counter in each of said stages after said fifth means has clocked said M-bit counter one time;

h. seventh means for clocking said N-bit counter of each of said stages $2^N$ times after said sixth means has decoupled said stages; and i. eighth means for checking an output of said M-bit counter to determine if said M-bit counter is working properly after said seventh means has clocked said N-bit counter of each of said stages $2^N$ times.

8. An M-bit counter as set forth in claim 7, wherein N is greater than or equal to 2.

* * * * *